United States Patent
Antaran

(10) Patent No.: US 11,425,838 B2
(45) Date of Patent: Aug. 23, 2022

(54) SWAPPABLE ELECTRONIC DEVICE AND SHELF SYSTEMS

(71) Applicant: Astec International Limited, Kowloon (HK)

(72) Inventor: Jerome G. Antaran, Paranaque (PH)

(73) Assignee: Astec International Limited, Kowloon (HK)

( * ) Notice: Subject to any disclaimer, the term of this patent is extended or adjusted under 35 U.S.C. 154(b) by 71 days.

(21) Appl. No.: 17/108,085

(22) Filed: Dec. 1, 2020

(65) Prior Publication Data

US 2022/0174837 A1 Jun. 2, 2022

(51) Int. Cl.
*H05K 7/14* (2006.01)
*H05K 5/02* (2006.01)

(52) U.S. Cl.
CPC ......... *H05K 7/1492* (2013.01); *H05K 5/0221* (2013.01)

(58) Field of Classification Search
CPC .. H05K 7/1492; H05K 5/0221; H05K 5/0021; H05K 5/0208; H05K 7/1409; H05K 7/1414
See application file for complete search history.

(56) References Cited

U.S. PATENT DOCUMENTS

| | | |
|---|---|---|
| 6,801,435 B1 | 10/2004 | Su et al. |
| 6,912,132 B2 | 6/2005 | Riddiford et al. |
| 7,200,004 B2 | 4/2007 | Chen et al. |
| 7,567,440 B2 | 7/2009 | Huang |
| 7,602,612 B2 | 10/2009 | Li |
| 8,472,183 B1 | 6/2013 | Ross et al. |
| 8,701,902 B2 | 4/2014 | Oura |
| 8,720,043 B2 | 5/2014 | Corddry et al. |
| 8,773,861 B2 | 7/2014 | Ross et al. |
| 8,824,149 B2 | 9/2014 | Wang |
| 8,867,214 B2 | 10/2014 | Ross et al. |
| 9,392,724 B2 | 7/2016 | Hafnor |
| 9,572,275 B2 * | 2/2017 | Kao ...................... H05K 7/1487 |
| 9,762,037 B1 | 9/2017 | Lach |
| 10,520,980 B2 | 12/2019 | Hu |
| 2010/0309611 A1 | 12/2010 | Fan et al. |
| 2013/0094156 A1 * | 4/2013 | Wang ...................... G06F 1/188 361/747 |

(Continued)

OTHER PUBLICATIONS

International Search Report and Written Opinion for PCT Application No. PCT/CN2021/0118253, dated Jan. 17, 2022; 12 pages.

*Primary Examiner* — Robert J Hoffberg
*Assistant Examiner* — Hung Q Dang

(57) ABSTRACT

An electronic module, such as a power module, may include a latch having two or more protrusions where a first protrusion can fix the electronic module into a shelf and the second protrusion can be a curved protrusion that activates the latch when an adjacent electronic module is inserted into or removed from the shelf. In some embodiments, a third protrusion may be included, where the first protrusion and the third protrusion both fix the electronic module to the shelf and are activated by the latch. Also, a shelf may include a partition between two electronic module receptacles that has a width that is less than a protrusion extending from a side wall of one of the electronic modules.

15 Claims, 14 Drawing Sheets

(56) References Cited

U.S. PATENT DOCUMENTS

| | | | | |
|---|---|---|---|---|
| 2013/0279123 A1* | 10/2013 | Lin | ................... | H05K 7/1487 |
| | | | | 361/747 |
| 2013/0314865 A1 | 11/2013 | Chuang et al. | | |
| 2019/0074667 A1 | 3/2019 | Huang | | |
| 2022/0015255 A1* | 1/2022 | Teeter | ................. | H05K 7/1475 |

* cited by examiner

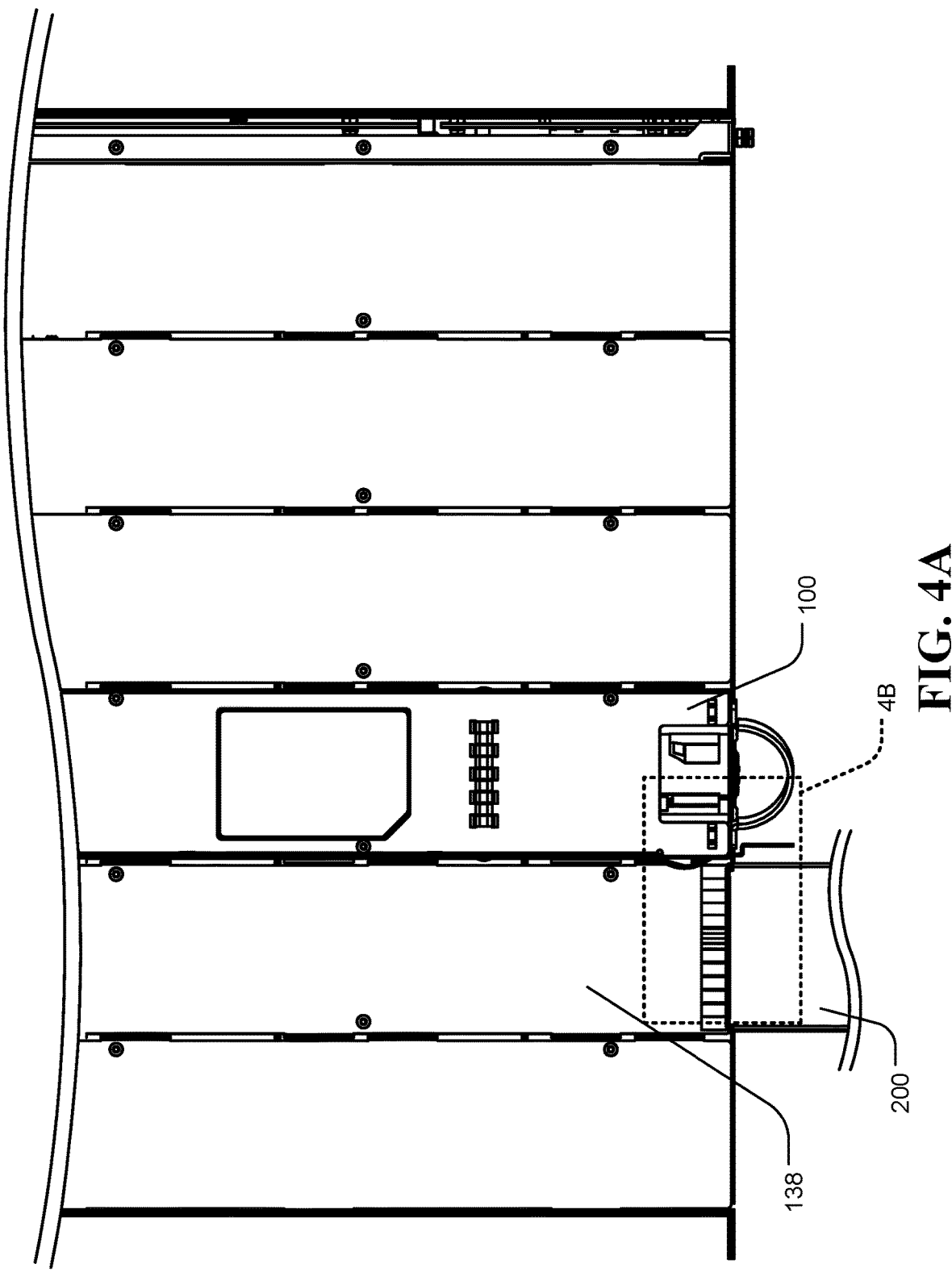

SWAPPABLE ELECTRONIC DEVICE AND SHELF SYSTEMS

BACKGROUND

Data centers and data servers have a need for efficient usage of space within their rack systems that hold electronic modules such as power modules (e.g., a power supply unit ("PSU")). Shelf systems have been implemented to hold an array of such electronic modules; however, space is limited within each shelf as the density of circuit(s) and parts within the electronic modules increase. Further, structures are needed to ensure the electronic modules are fixed into the shelf and will not eject when undergoing shock or vibrations. The embodiments described herein provide solutions to these problems.

SUMMARY

In certain embodiments, an electronic device may be swappable to be embedded into a shelf having a receiving structure. The electronic device may comprise a casing including a first side wall, a second side wall, and an end portion, the first side wall having a first opening and a second opening, and a latch including an elongated plate having a first end part, a second end part, a first protrusion part, and a second protrusion part. The first end part can be fixed on an inner surface of the first side wall wherein the first protrusion part at least partially extends out of the first side wall through the first opening and the second protrusion part at least partially extends out of the first side wall through the second opening. The second end part can extend through an opening of the end portion to be exposed outside the casing wherein an external force can be exerted on the second end part to have the first protrusion part at least partially sunken into the casing. The first protrusion part can include a locking structure to fix the electronic device into the receiving structure when an external force is not applied to the second end part. The second protrusion part can be an elongated curved member where both ends of the elongated curved member are coupled to the elongated plate such that when pressure is applied to the second protrusion part the latch is activated to have the first protrusion part at least partially sunken into the casing.

In certain embodiments, a system can comprise a first electronic module including a first housing having a first side wall, a second side wall, a proximal end wall, and a distal end wall, where the first side wall has a first opening and a second opening. The system can also include a latch with a plate having a proximal end, a distal end, a first protrusion part, and a second protrusion part, where both the first protrusion part and the second protrusion part are disposed between the proximal end and the distal end. The distal end can be fixed within the first housing such that the first protrusion part at least partially extends out of the first side wall through the first opening and the second protrusion part at least partially extends out of the first side wall through the second opening. The first protrusion part can include a locking structure to fix the first electronic module into a receiving structure and the second protrusion part can be a curved member where both ends of the curved member are coupled to the plate such that when pressure is applied to the second protrusion part the latch is activated to have the first protrusion part at least partially sunken into the first housing.

In certain embodiments, a system can comprise a shelf configured to hold a first power module and a second power module. The shelf can include a first side wall, a second side wall, a top portion, a bottom portion, a back portion, and a partition substantially parallel to the first side wall and the second side wall. The partition can be disposed between the top portion and the bottom portion to allow the first power module to be inserted into the shelf on a first side of the partition and the second power module to be inserted into the shelf on a second side of the partition. The width of the partition can be less than a length of a latch protrusion extending from a side of the first power module.

BRIEF DESCRIPTION OF THE DRAWINGS

FIGS. 4A, 4B, and 4C are top-down views of a swappable electronic device and shelf system, in accordance with certain embodiments of the present disclosure;

DETAILED DESCRIPTION

Figure 1:
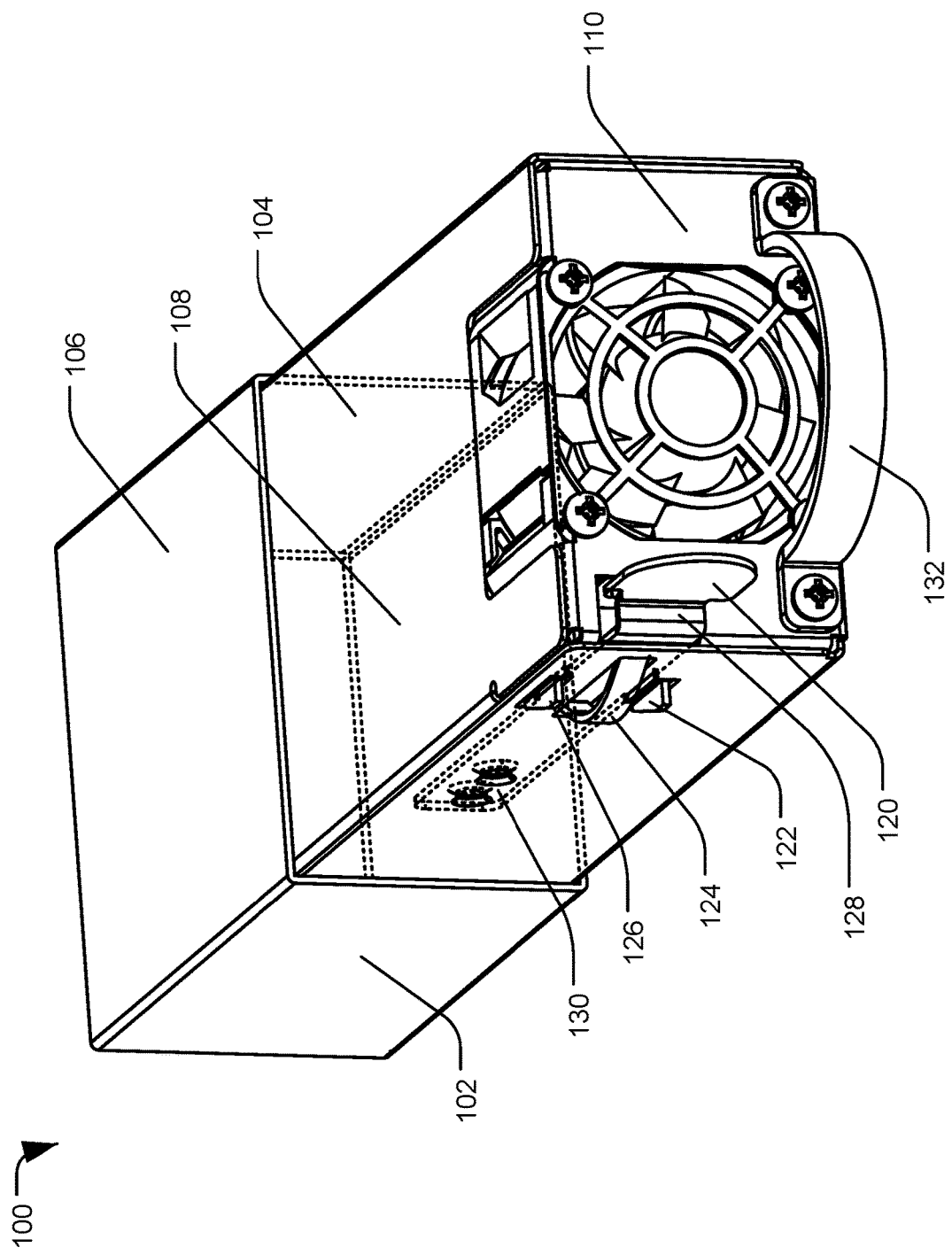
FIG. 1 is an isometric view of a swappable electronic device, in accordance with certain embodiments of the present disclosure.

In the following detailed description of certain embodiments, reference is made to the accompanying drawings which form a part hereof, and in which are shown by way of illustration of example embodiments. It is also to be understood that features of the embodiments and examples herein can be combined, exchanged, or removed, other embodiments may be utilized or created, and structural changes may be made without departing from the scope of the present disclosure.

With ever increasing density for electronic components for server racks, such as PSUs, every millimeter of space inside a server cabinet or shelf matters. When considering a server shelf that can house multiple electronic modules or devices, reducing a vertical partition width between adjacent modules can be an effective design to allow for a higher density of electronic components or modules. However, a problem arises when a latch protrusion (e.g., teeth that extend beyond a side wall of a module) has to be of enough length to ensure the electronic module will not eject when undergoing shock and vibration and such length requires the partition to be at least as wide as the length to avoid damaging the adjacent electronic module.

This disclosure provides solutions for this problem, including a swappable electronic module and shelf system, where the electronic module includes a latch protrusion greater than a vertical partition width of the shelf. Further, some embodiments keep the whole rectangular cross-section of the electronic module usable, that is, the interior capacity of the housing does not have to be reduced to accommodate an updated latch and narrower partition, thus preserving space for the ever increasing density in electronics inside the housing. This can allow the electronic modules to be designed with a wider width due to the narrower partitions of the shelf.

In specific examples, this can include a shelf and swappable module system where vertical partitions can have a width that is less than the width of a latch protrusions (e.g., the partition is less than 3.0 millimeters wide). In some solutions describe herein, this can be accomplished by using a hump protrusion that extends from an electronic module, where the hump protrusion is pushed when an adjacent electronic module is being inserted or removed from an adjacent slot in a shelf, and the hump protrusion is attached to the latch to activate the latch when the hump protrusion is pushed. Without the hump, an electronic module being pushed into or pulled from the adjacent slot of the shelf may be scratched or stopped from entering or leaving the slot by protrusions from an adjacent module.

On other latch designs, if the partition is narrower compared to the latch protrusion, the latch protrusion will protrude out of the partition into the adjacent slot of the shelf, which can prevent a second electronic module from being inserted or pulled out of the adjacent slot without activating the latch on the first electronic module also. Thus, one would possibly need two people to swap an electronic module with such a design.

However, in the latch and shelf designs provided herein, vertical partitions within a shelf can be minimized as low as the thickness of a sheet metal (e.g., 0.8 mm) while keeping the latch protrusion at a "regular" size (e.g., 3.0 mm). This can also allow the electronic module to have a rectangular cross section maintained along the length of the electronic module. The following description of the figures provide additional details and implementations of these solutions, as well as other solutions.

FIG. 1 an isometric view of a swappable electronic device, generally designated 100, in accordance with certain embodiments of the present disclosure. The electronic module 100 may be a swappable PSU or other electronic device designed to be hot-pluggable into a shelf or server rack. The electronic module 100 can include a housing or casing having a first side wall 102, a second side wall 104, a top portion 106, a bottom portion 108, a front or proximal portion 110, and a back or distal portion (not shown) that is, generally, at the opposite end of the electronic module 100 from the proximal portion. Further, the electronic module 100 may include a latch 120 that can include two or more protrusions.

In some embodiments, the latch 120 can include a first protrusion 122 and a second protrusion 124 that at least partially extend through one or more openings of the first side wall 102. In some embodiments, there may be more than two protrusions, such as a third protrusion 126. Further, the first protrusion 122 and the second protrusion 124 may at least partially extend through a first opening and a second opening of the first side wall 102. The first protrusion 122 and the third protrusion 126, separately or collectively, may be referred to as "teeth" that provide a locking mechanism for the electronic module 100 to secure itself into a shelf. For example, the teeth can protrude from the electronic module 100 into a portion of a shelf (not shown, see next Figures) that secures the electronic module 100 into the shelf until the teeth are activated by the latch 120 to be withdrawn from the shelf.

The first protrusion 122 and the second protrusion 124 may be disposed between a proximal end 128 and a distal end 130 of the latch 120. The distal end 130 of the latch 120 may be attached inside of the housing, such as to the first side wall 102, and the proximal end 128 of the latch 120 may extend through an opening to outside of the electronic module 100. The opening may be an opening provided through the front portion 110 such that the distal end 130 is accessible when the electronic module 100 is fixed within a shelf.

The latch 120 may be an elongated plate constructed of a resilient material or spring metal, such as stainless steel (e.g. SAE304 or SUS304). The first protrusion 122, second protrusion 124, and third protrusion 126 may be constructed from a single piece or may be constructed as separate pieces attached to the latch 120. The first protrusion 122, second protrusion 124, and third protrusion 126 may be constructed from a same material as the latch 120 or a different material. Further, in some embodiments, the second protrusion 124 is formed from a cutout section of the latch 120.

The latch 120 may be activated by a tab located at the proximal end of the latch 120 or by the second protrusion 124. When activated, the latch 120 will cause the first protrusion 122 and the second protrusion 124 to at least partially recess into the first opening and second opening, respectively, of the first side wall 102. In some embodiments, the first protrusion 122 can recess fully within the first opening of the first side wall 102 when the latch 120 is activated, such that no portion of the first protrusion 122 extends beyond a plane formed from the exterior of the first side wall 102. In further embodiments, activating the latch 120 may also cause the third protrusion 126 to recess partially or fully within the first side wall 102.

In some embodiments, the second protrusion 124 can be an elongated curved member attached to the latch 120 that forms a hump protruding away from the first side wall 102. The latch 120 can be activated by applying a force to the second protrusion 124, where the force will cause the second protrusion 124 to push the latch 120 and movement of the latch 120 will cause the first protrusion 122 to recess into the first side wall 102.

A handle 132 can be attached to the housing toward the proximal end that allows a user to push or pull the electronic module 100 into or out of a shelf. Further, one or more power connectors, such as an Alternating Current (AC) voltage input and Direct Current (DC) voltage output, may be located at the distal end of the housing (not shown). A power circuit to convert the AC voltage input to the DC voltage output, a fan, a control circuit, or other circuits maybe included within the housing.

Figure 2:
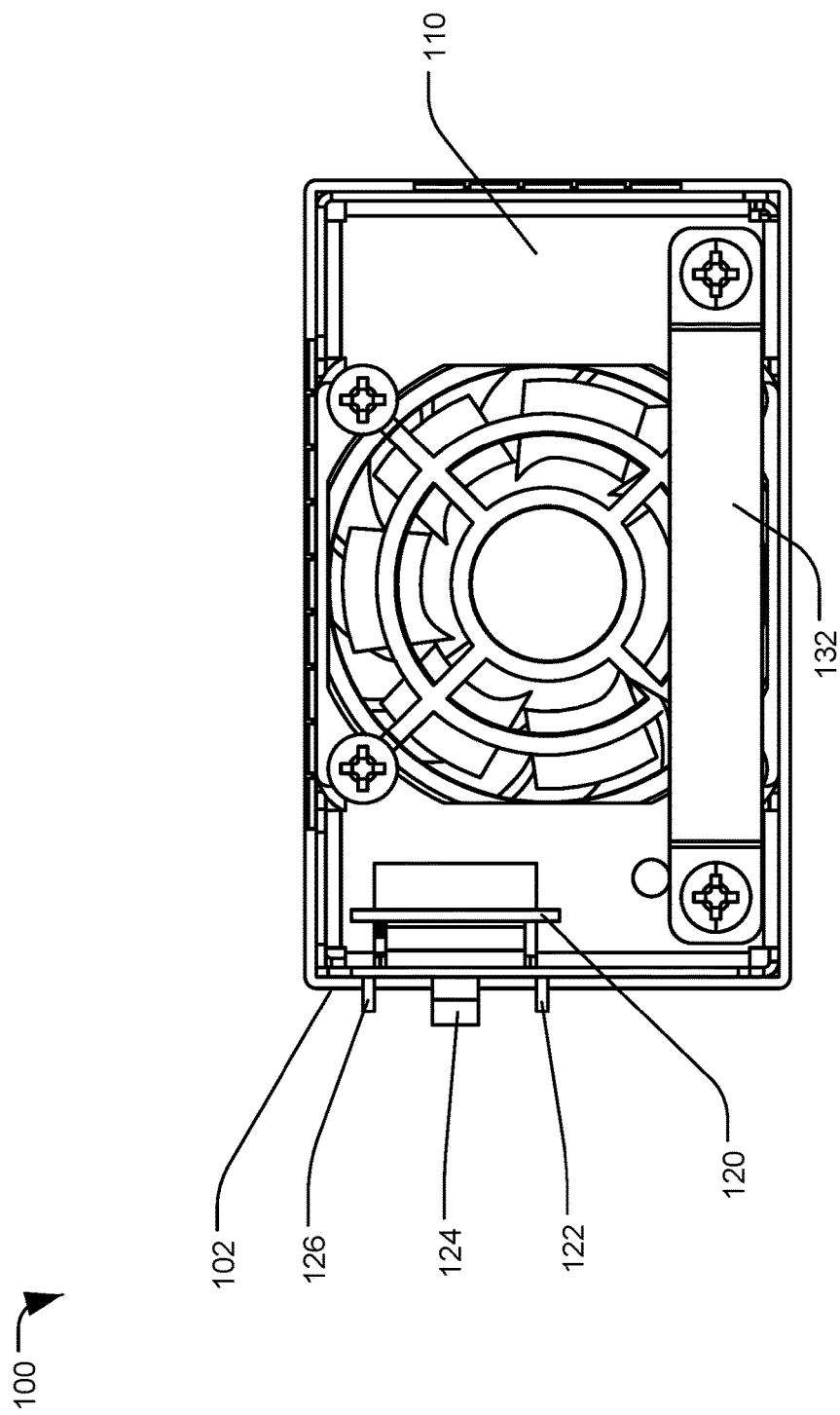
FIG. 2 is a view of the end wall of the swappable electronic device, in accordance with certain embodiments of the present disclosure.

FIG. 2 is a view facing the front of the electronic module 100 with the latch 120, in accordance with certain embodiments of the present disclosure. From this view, one can see that the first protrusion 122, second protrusion 124, and third protrusion 126 can extend beyond on the first side wall 102 when the latch 120 is not activated.

Figure 3A:
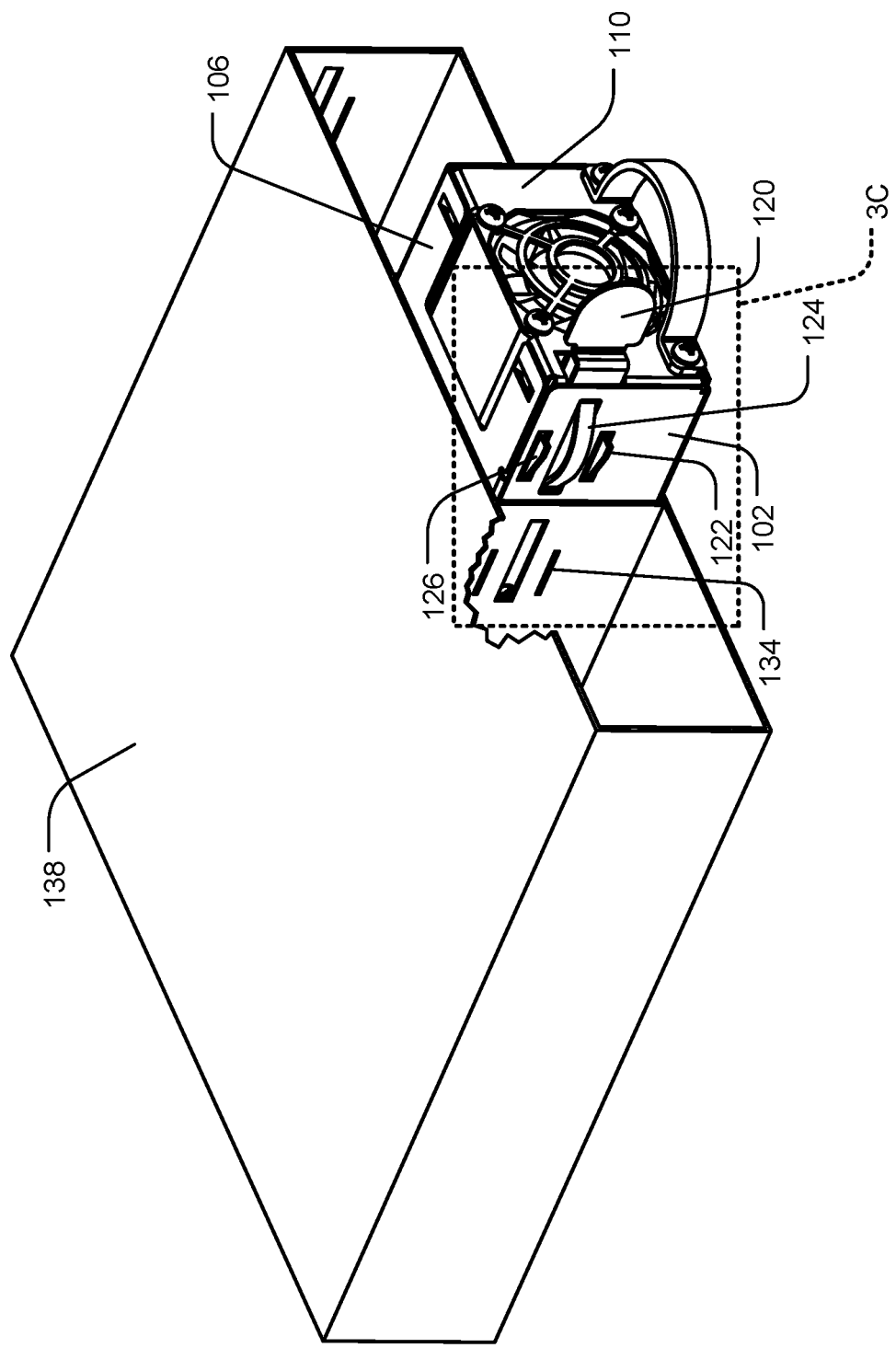
FIGS. 3A, 3B, and 3C are isometric views of a swappable electronic device and shelf system, in accordance with certain embodiments of the present disclosure.
Figure 3B:
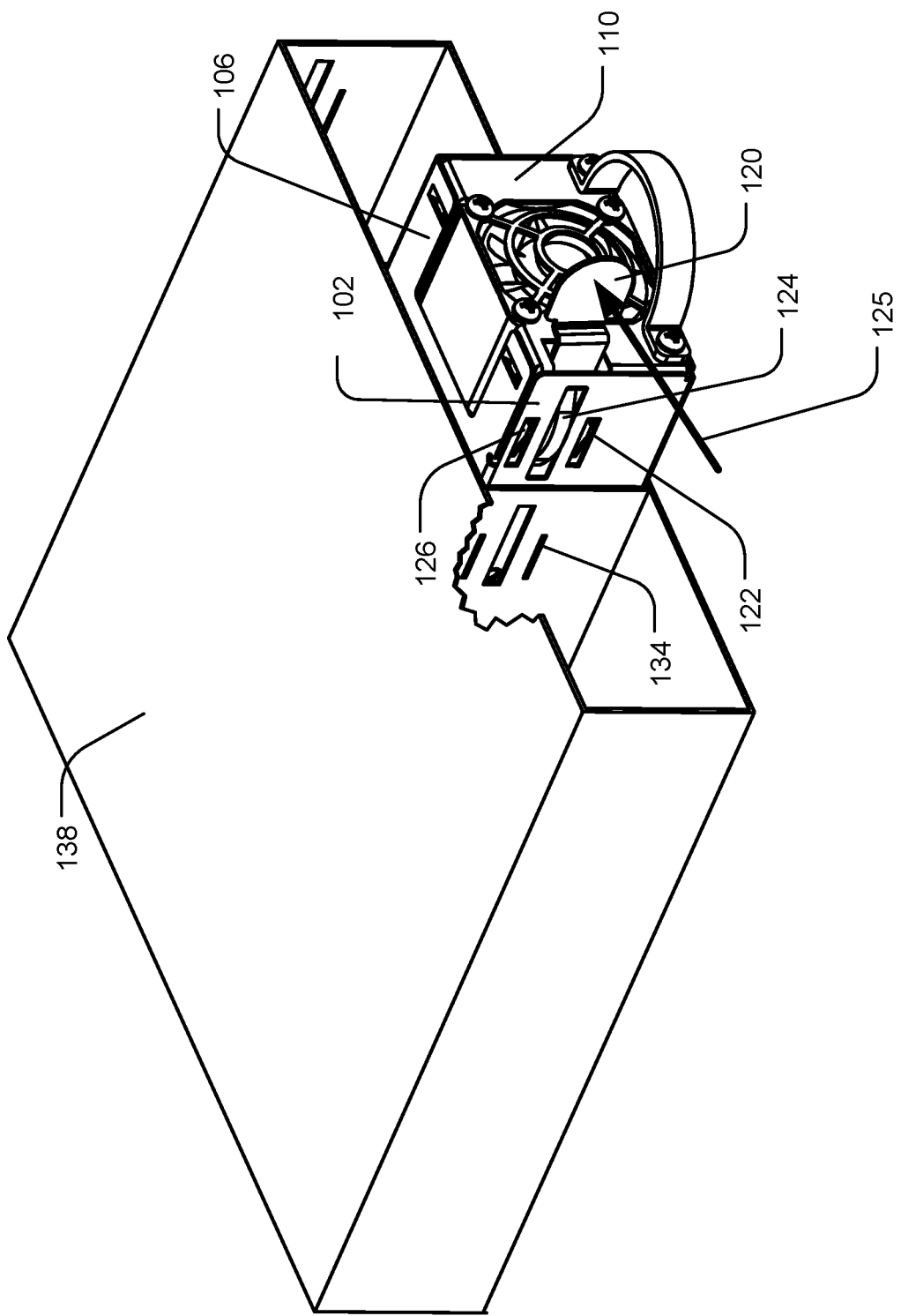
Figure 3C:
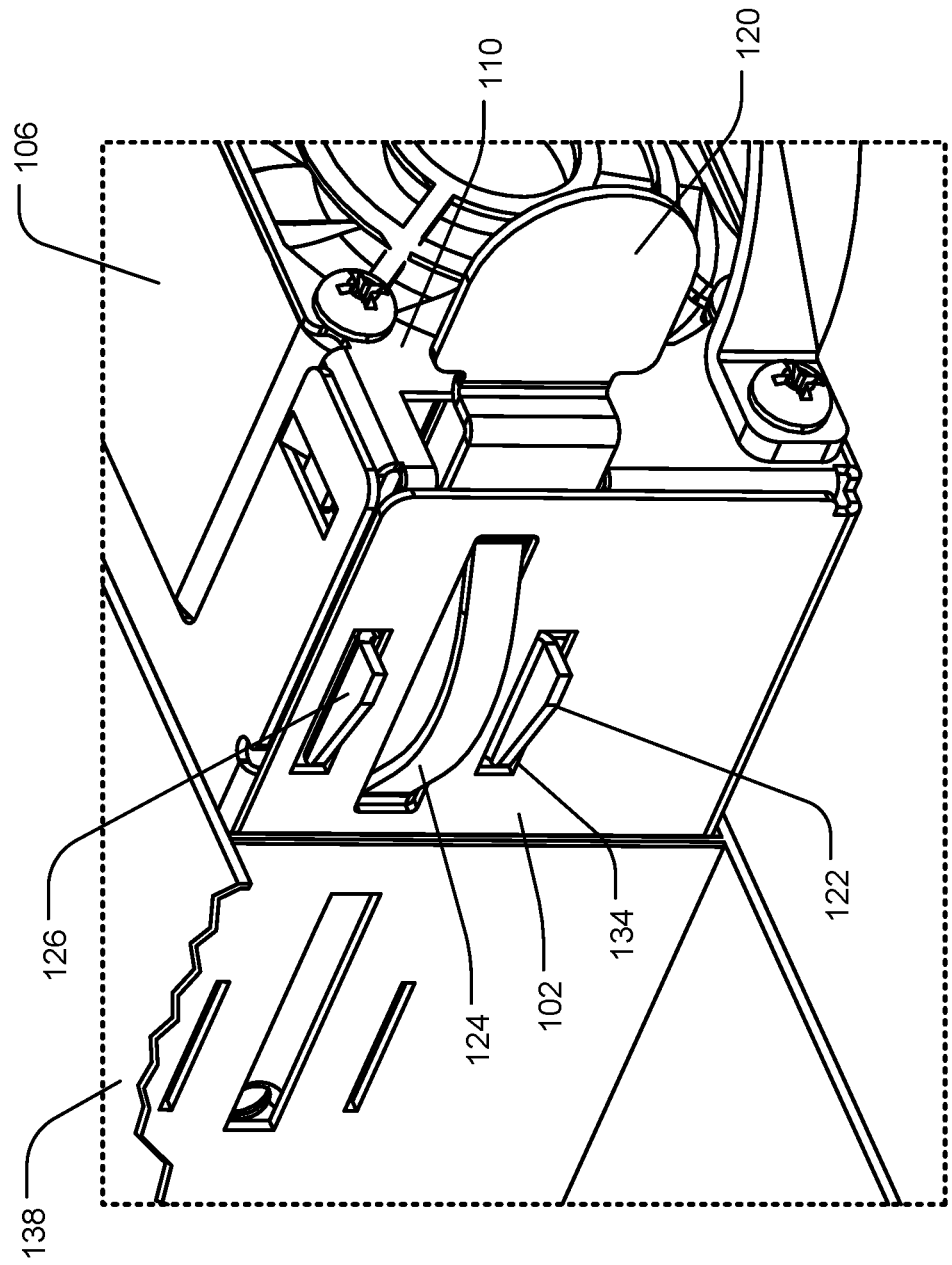

FIGS. 3A, 3B, and 3C are isometric views of the electronic module 100 and shelf 138 showing activation of the latch 120, in accordance with certain embodiments of the present disclosure. FIG. 3A shows a compatible swappable electronic module 100 in a shelf 138, where the latch 120 is not activated. FIG. 3B shows the electronic module 100 in the shelf 138, where the latch 120 is activated. As seen in FIG. 3B, the first protrusion 122, second protrusion 124, and third protrusion 126 are at least partially withdrawn into the first side wall 102 when the latch 120 is activated. The latch 120 may be activated by applying pressure to the proximal end 128, such as by applying a force in the direction of the arrow 125. The side wall 102 can also include one or more openings or slots 134 from which the first protrusion 122, second protrusion 124, and third protrusion 126 are extended from the latch 120. FIG. 3C shows a close-up view of the swappable electronic device 100 and shelf 138.

Figure 4C:
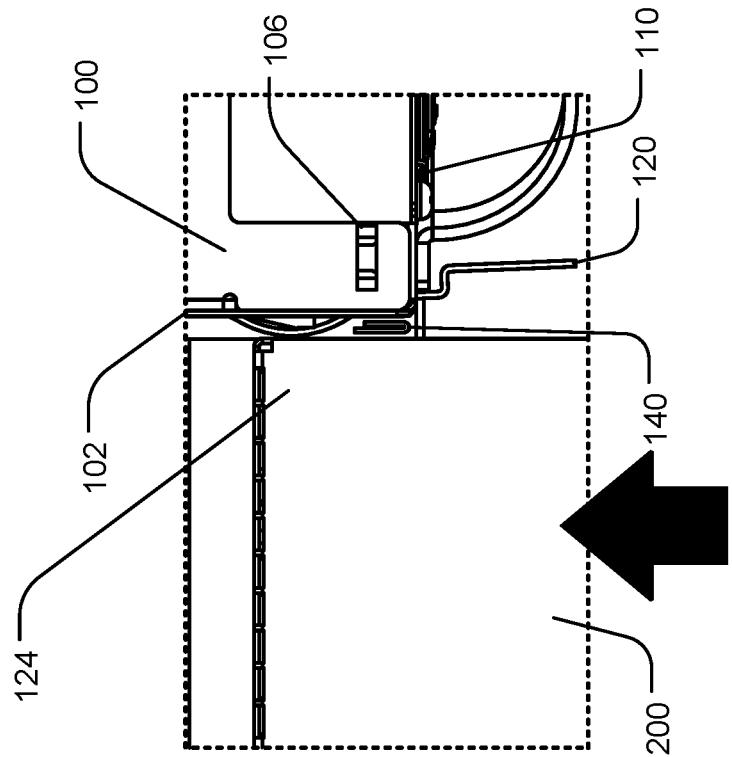
Figure 4B:
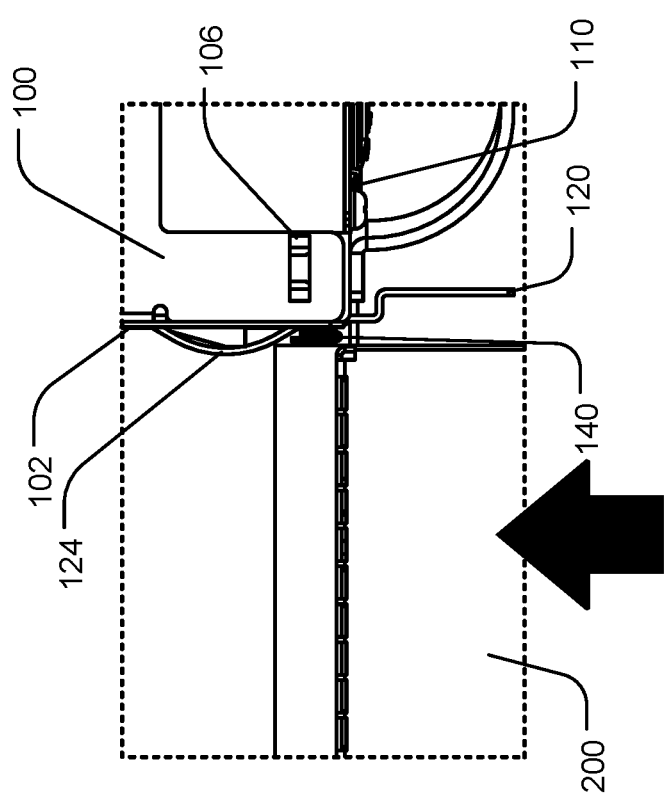

FIGS. 4A, 4B, and 4C are top-down views of the electronic module 100 and shelf 138 system showing activation of the latch 120, in accordance with certain embodiments of the present disclosure. FIGS. 4A and 4B show a position of the second protrusion 124 when it is not pushed and therefore not activating the latch 120. FIG. 4C shows a position of the second protrusion 124 when it is pushed and therefore is activating the latch 120. For example, when the first electronic module 100 is fixed at a position within a shelf 138 adjacent a partition 140, the latch 120 can be activated by force being applied to the second protrusion 124 due to the second electronic module 200 being inserted or removed from the adjacent slot of the shelf 138. In the example depicted in FIGS. 4B and 4C, the second electronic module 200 is being inserted or pushed into the shelf 138 in the direction of the arrow, which activates the latch 120; the latch 120 will also be activated when the second electronic module 200 is removed or pulled from the shelf 138.

Figure 5A:
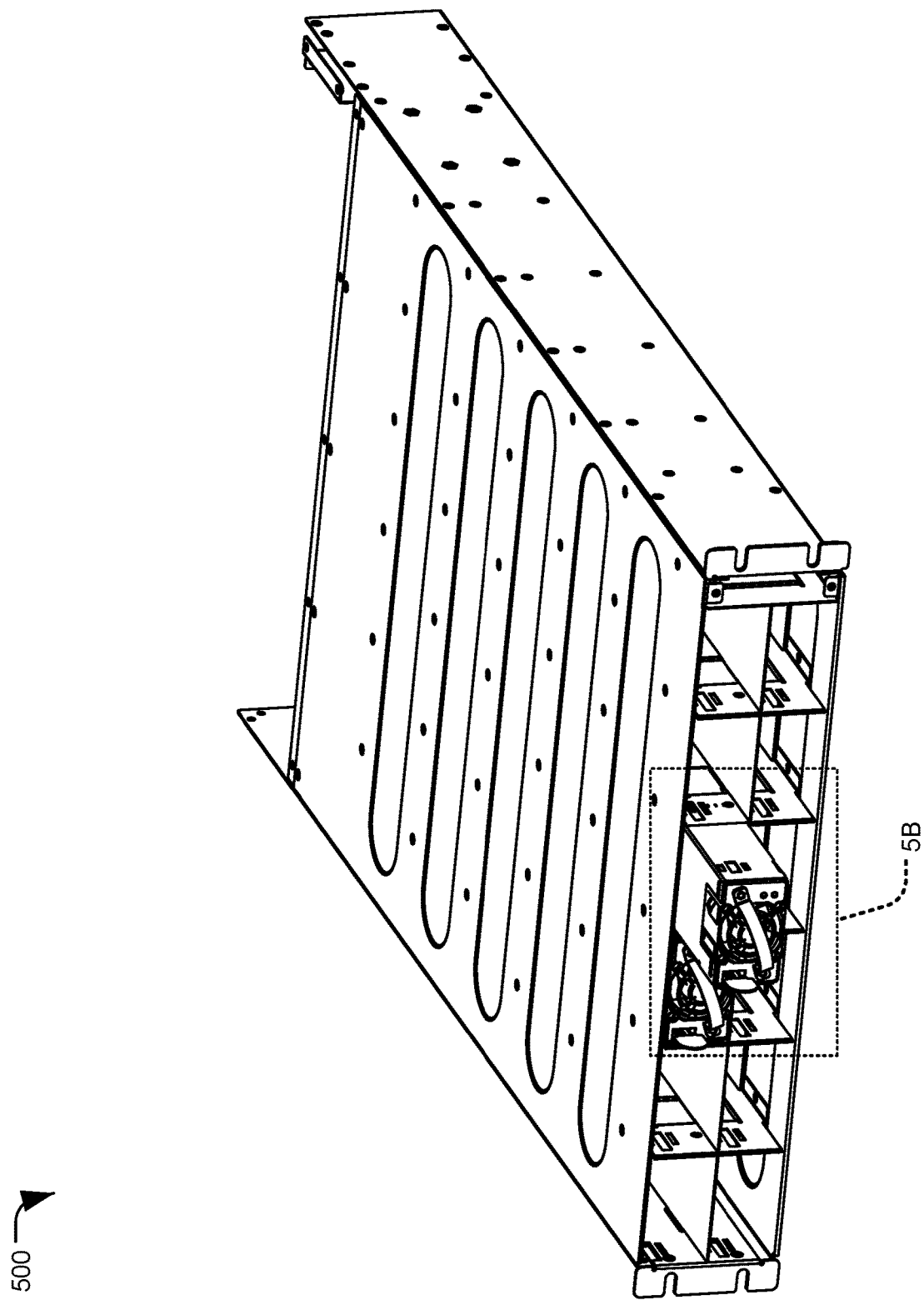
FIGS. 5A and 5B are isometric views of a swappable electronic device and shelf system, in accordance with certain embodiments of the present disclosure.
Figure 5B:
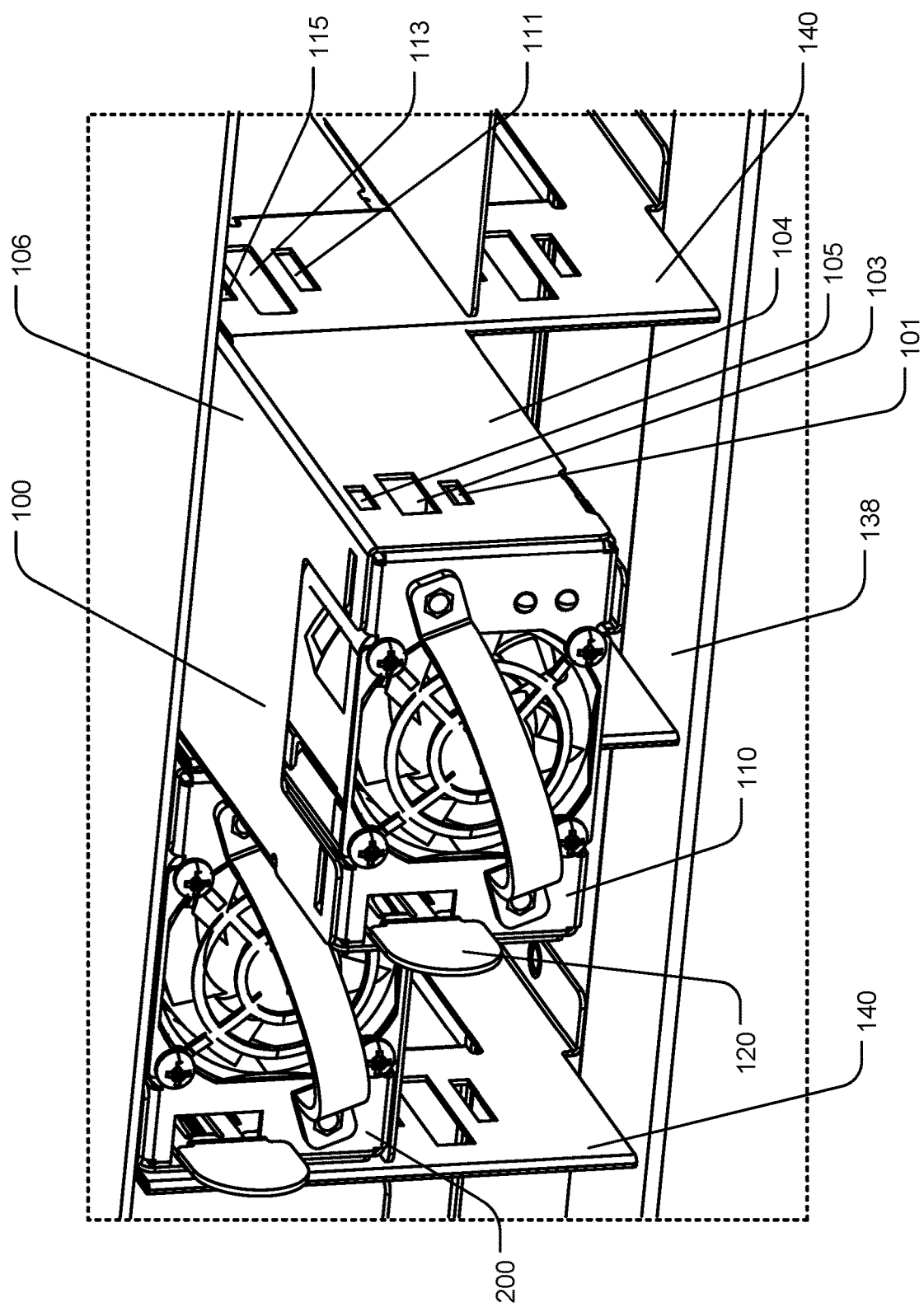

FIGS. 5A and 5B are an isometric views of a system with the electronic module 100 and the shelf 138, in accordance with certain embodiments of the present disclosure. The system 500 can include the shelf 138 and one or more electronic modules, such as module 100, module 200, or both. The shelf 138 can include an embedded or hot-pluggable controller (not shown) for monitoring and control of the first electronic module 100 and the second electronic module 200 over a management network.

The shelf 138 may include one or more partitions 140 that can have at least one opening therein to accommodate the protrusions from the first electronic module 100. For example, partition 140 may have a first slot 111 and a second slot 113 to accommodate the first protrusion 122 and the second protrusion 124, respectively. The partition 140 may also have a third slot 115 to accommodate the third protrusion 126 as needed.

The electronic module 100 may have one or more openings on the second side wall 104 that at least partially align with opening(s) in the partition 140. For example, the first electronic module 100 may have a first slot 101, a second slot 103, and a third slot 105 on the second side wall 104 that correspond to and at least partially align with the first slot 111, the second slot 113, and the third slot 115 of the partition 140 when the electronic module 100 is fully inserted into the shelf 138. The first slot 101, second slot 103, and third slot 105 can allow protrusions from an adjacent module (not shown) that extend through the partition 140 to extend into the housing of the first module 100, thereby preventing the extending protrusions from damaging the first module 100.

Figure 6:
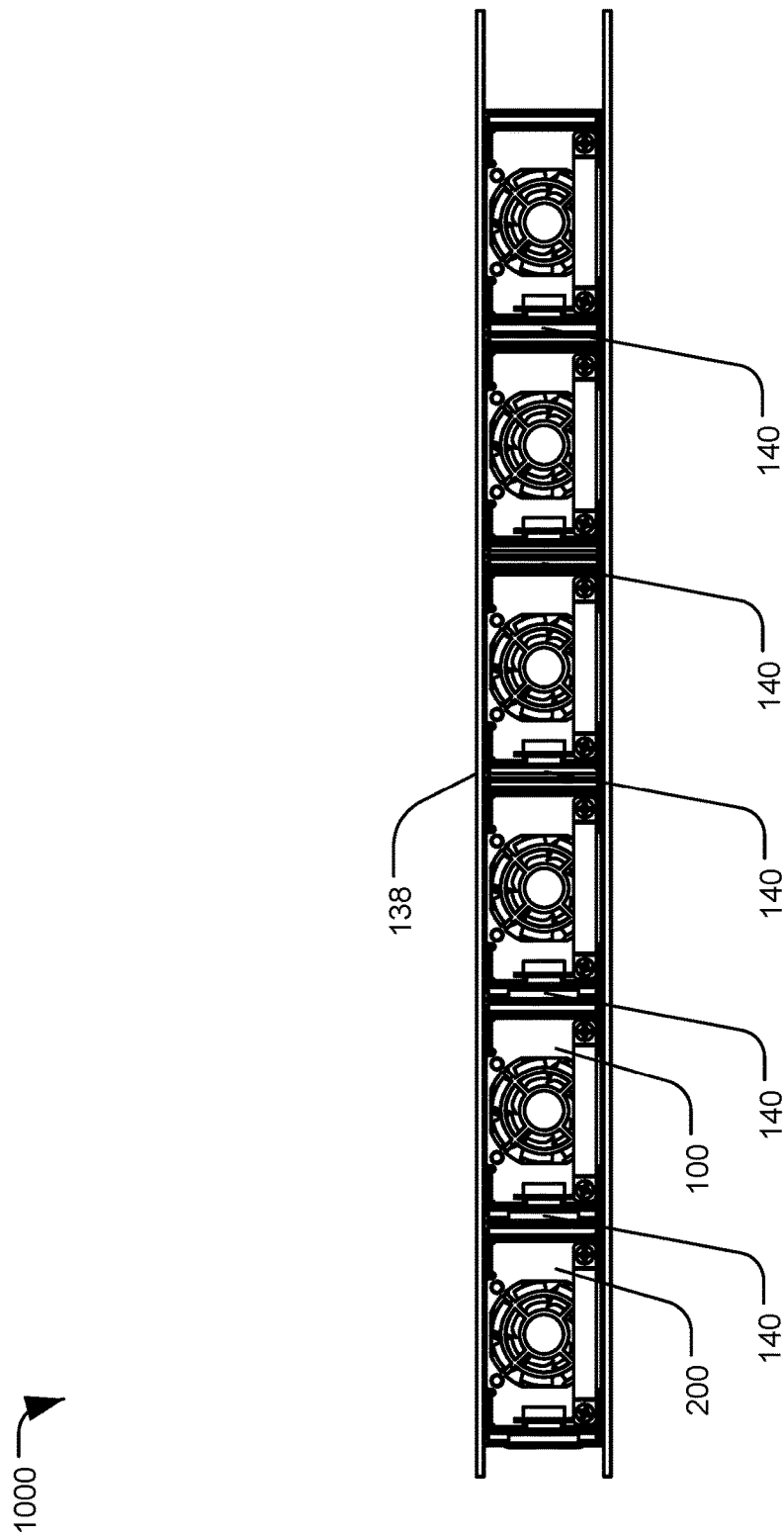
FIG. 6 is a view of a shelf system including multiple electronic modules, in accordance with certain embodiments of the present disclosure.

FIG. 6 is a view of a shelf system 138 including multiple electronic modules, such as electronic modules 100 and 200, in accordance with certain embodiments of the present disclosure. The shelf system 138 may hold more than two compatible electronic modules and, in some embodiments, may hold six electronic modules such as six PSUs. The shelf system 138 may have a partition 140 between each set of adjacent electronic modules that allows the latch for each respective electronic module to lock itself in a fixed position within the shelf 138.

Figure 7A:
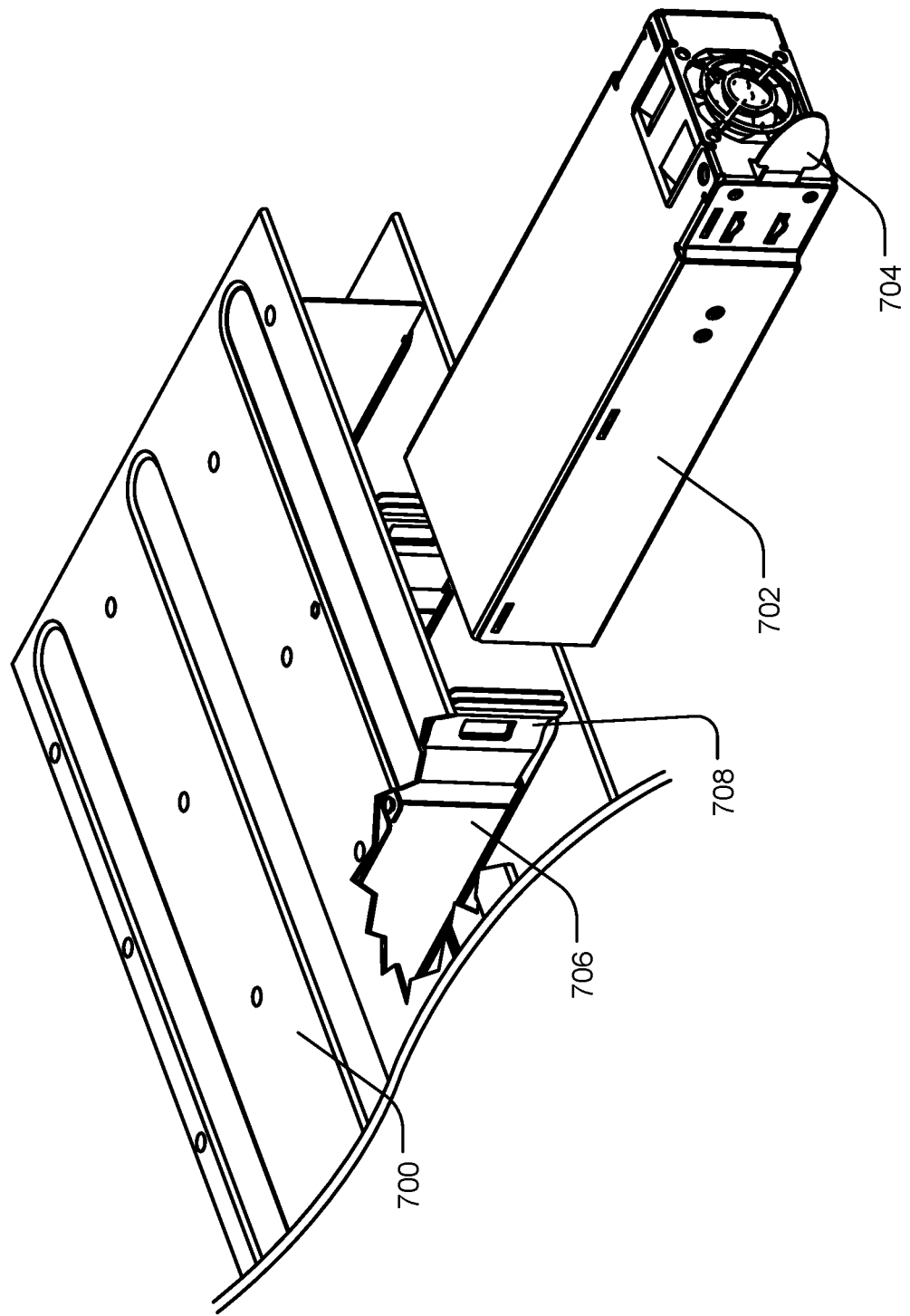
FIGS. 7A and 7B are isometric views of a swappable electronic device and shelf system, in accordance with certain embodiments of the present disclosure.
Figure 7B:
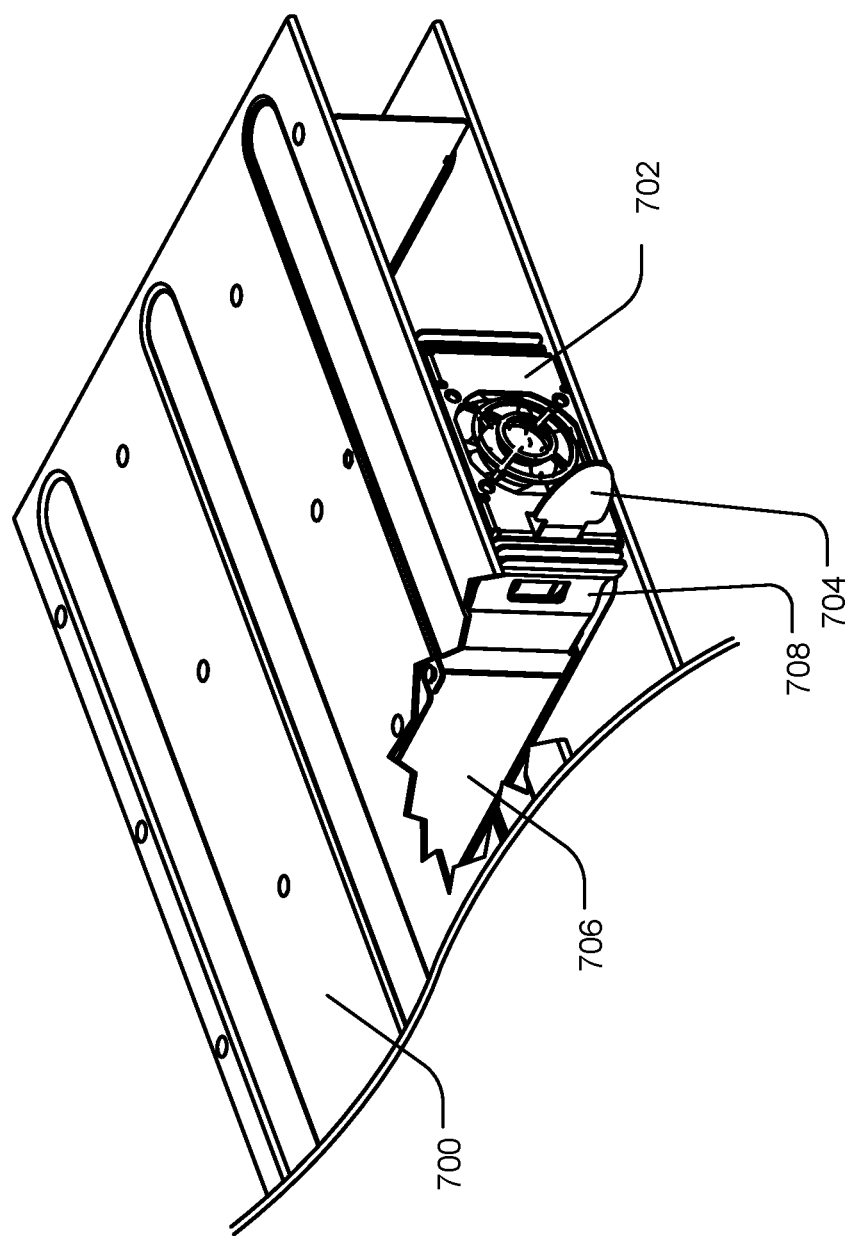
Figure 7C:
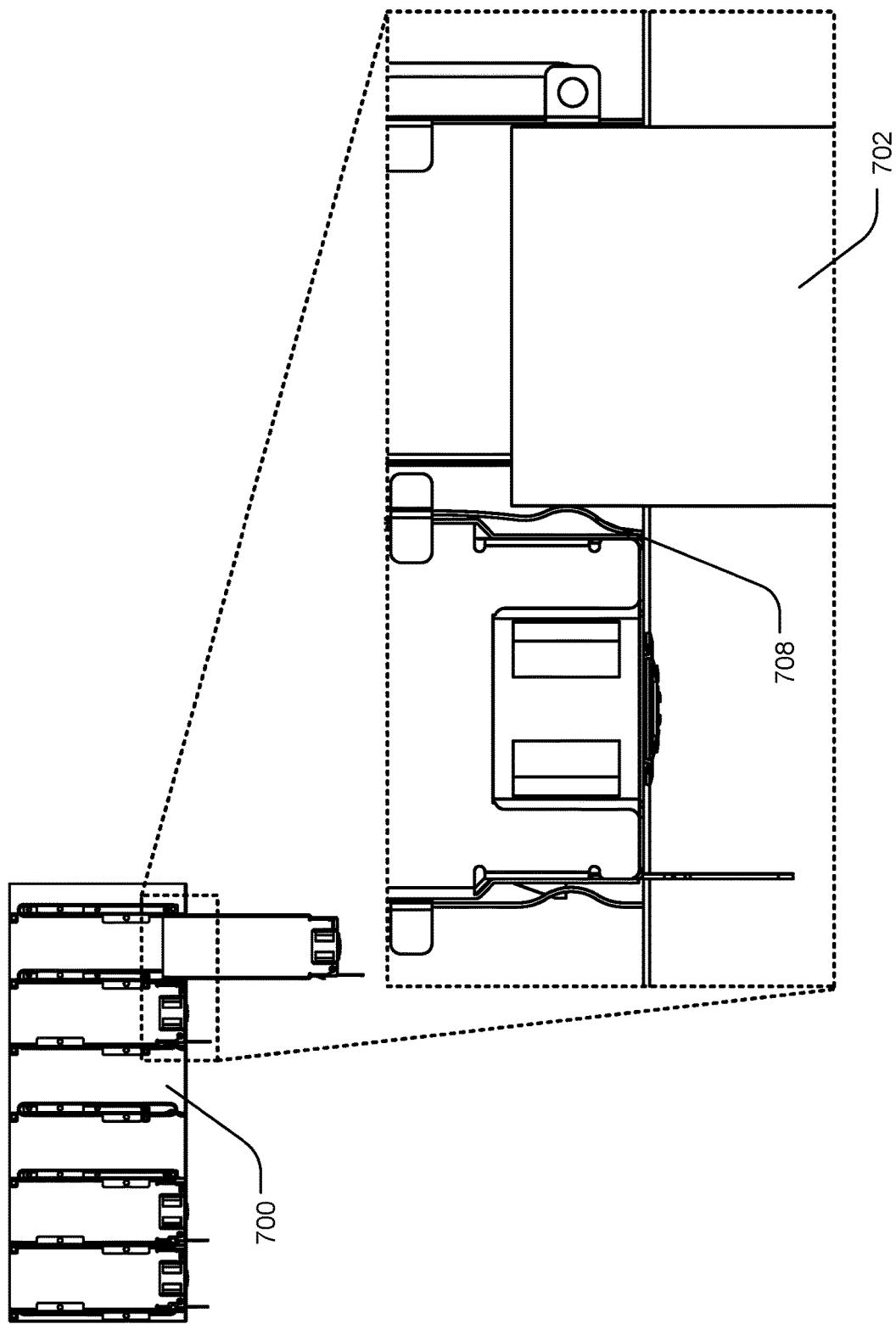
FIGS. 7C and 7D are top-down views of a swappable electronic device and shelf system, in accordance with certain embodiments of the present disclosure.
Figure 7D:
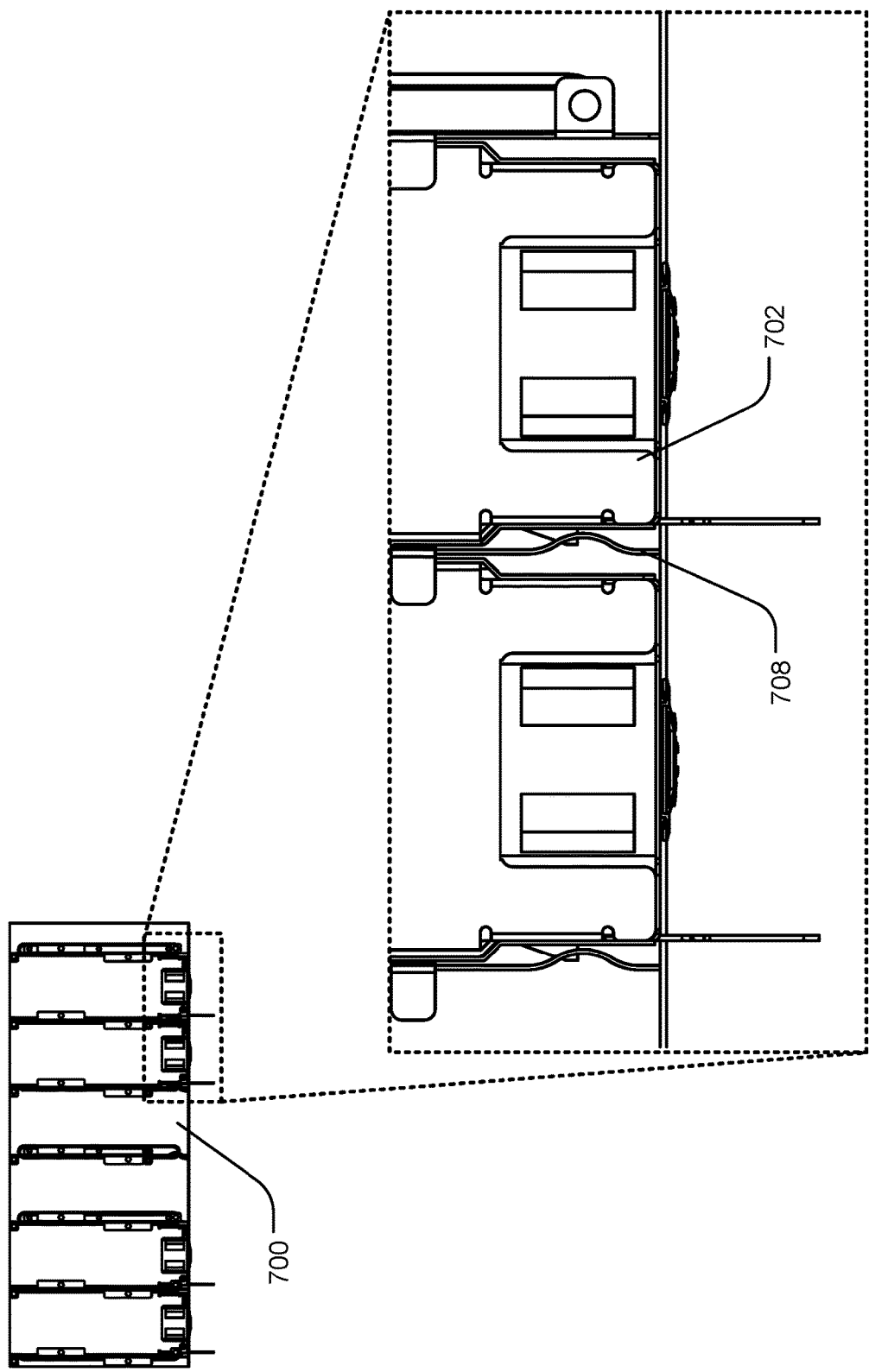

FIGS. 7A and 7B are isometric views of a shelf system 700 with an electronic module 702, in accordance with certain embodiments of the present disclosure. FIGS. 7C and 7D are top-down views of a shelf system 700 with an electronic module 702, in accordance with certain embodiments of the present disclosure. The electronic module 702 can include a first latch 704 that is configured to activate one or more latch protrusions, as discussed herein. The shelf system 700 may also include one or more partitions 706 that also include a second shelf latch 708.

FIG. 7A shows an isometric view of the shelf system 700 in relation to the electronic module 702. FIG. 7B shows an isometric view of the electronic module 702 fully inserted into a slot of the shelf system 700. FIG. 7C shows a top-down view of the shelf latch 708 being activated by the electronic module 702. FIG. 7D shows a top-down view of the electronic module 702 fully inserted into the slot of the shelf system 700 and the shelf latch 708 in its resting or not activated position.

The second shelf latch 708 may be made from a resilient metal and may be formed to be a curved member that allows the second shelf latch 708 to be pushed as the electronic module 702 is inserted or removed from the shelf system 700. When the electronic module 702 is fully inserted into a slot of the shelf system 700, the second shelf latch 708 will return to its resting position, thereby locking the first electronic module 702 into the shelf The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above embodiments can be made, and other embodiments not specifically described herein will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An electronic device swappable to be embedded into a shelf having a receiving structure, the electronic device comprising:
   a casing including a first side wall, a second side wall, and an end portion, the first side wall having a first opening and a second opening; and
   a latch including an elongated plate having a first end part, a second end part, a first protrusion part, and a second protrusion part;
   the first end part fixed on an inner surface of the first side wall wherein the first protrusion part at least partially extends out of the first side wall through the first opening and the second protrusion part at least partially extends out of the first side wall through the second opening;

the second end part extending through an opening of the end portion to be exposed outside the casing wherein an external force can be exerted on the second end part to have the first protrusion part at least partially sunken into the casing; the first protrusion part including a locking structure to fix the electronic device into the receiving structure when an external force is not applied to the second end part;

the second protrusion part is an elongated curved member where both ends of the elongated curved member are coupled to the elongated plate such that when pressure is applied to the second protrusion part the latch is activated to have the first protrusion part at least partially sunken into the casing; and the second side wall including a third opening and a fourth opening, wherein the third opening is positioned to receive a first protrusion part of an adjacent electronic device and the fourth opening is positioned to receive a second protrusion part of the adjacent electronic device.

2. The electronic device of claim 1 further comprising the first protrusion part and the second protrusion part disposed between the first end part and the second end part.

3. The electronic device of claim 1 further comprising the elongated curved member formed from a portion of the elongated plate.

4. The electronic device of claim 1 wherein the latch comprises a resilient metal.

5. The electronic device of claim 1 further comprising the first side wall including a third opening and the latch including a third protrusion part, wherein the third protrusion part at least partially extends out of the first side wall through the third opening.

6. The electronic device of claim 5 further comprising the second protrusion part is disposed between the first protrusion part and the third protrusion part.

7. The electronic device of claim 1 further comprising the electronic device is a power supply unit that converts alternating current (AC) voltage to direct current (DC) voltage and is compatible to be inserted into a shelf that can hold multiple power supply units.

8. The electronic device of claim 7 further comprising a handle over the end portion and a back portion including a power connector.

9. A system comprising:
a first electronic module including: a first housing having a first side wall, a second side wall, a proximal end wall, and a distal end wall, the first side wall having a first opening and a second opening;
a latch including a plate having a proximal end, a distal end, a first protrusion part, and a second protrusion part, where both the first protrusion part and the second protrusion part are disposed between the proximal end and the distal end;
the distal end fixed within the first housing such that the first protrusion part at least partially extends out of the first side wall through the first opening and the second protrusion part at least partially extends out of the first side wall through the second opening;
the first protrusion part including a locking structure to fix the first electronic module into a receiving structure;
the second protrusion part is a curved member where both ends of the curved member are coupled to the plate such that when pressure is applied to the second protrusion part the latch is activated to have the first protrusion part at least partially sunken into the first housing;
the second side wall including a third opening and a fourth opening, wherein the third opening is positioned to receive a first protrusion part of a second electronic module and the fourth opening is positioned to receive a second protrusion part of the adjacent electronic device.

10. The system of claim 9 further comprising the first electronic module is a power supply unit that converts alternating current (AC) voltage to direct current (DC) voltage and is compatible to be inserted into a shelf that can hold multiple power supply units.

11. The system of claim 9 further comprising:
a shelf configured to hold multiple electronic modules, the shelf including a first side wall, a second side wall, a top portion, a bottom portion, a back portion, and a partition substantially parallel to the first side wall and the second side wall, the partition disposed between the top portion and the bottom portion to allow the first electronic module to be inserted into the shelf on a first side of the partition and the second electronic module to be inserted into the shelf on a second side of the partition;
wherein the partition includes a third opening to receive the first protrusion and fix the first electronic module into the first side in a fixed position; and
wherein a width of the partition is less than a length of the first protrusion part extending from the first electronic module when the first electronic module is in the fixed position.

12. The system of claim 11 further comprising:
the second electronic module including:
a second housing having a first side wall, a second side wall, a proximal end wall, and a distal end wall, a latch having a first protrusion to fix the second electronic module to the shelf and a second protrusion to activate the latch;
the first side wall having a first opening and a second opening, wherein the first protrusion extends through the first opening and the second protrusion extends through the second opening of the second housing;
the second side wall of the second housing has a third opening and a fourth opening; and
wherein the third opening of the second housing receives the first protrusion part of the first electronic module and the fourth opening of the second housing receives the second protrusion part of the first electronic module when both the first electronic module and the second electronic module are fixed in the shelf.

13. The system of claim 11 further comprising the shelf includes a hot-pluggable controller for monitoring and control of the first electronic module and the second electronic module over a management network.

14. The system of claim 13 further comprising the shelf has a capacity to hold six electronic modules, with a partition between each set of adjacent modules.

15. The system of claim 9 further comprising the proximal end of the latch extending through an opening of the proximal end wall wherein an external force can be exerted on the proximal end to have the first protrusion part at least partially sunken into the first housing.

* * * * *

UNITED STATES PATENT AND TRADEMARK OFFICE
CERTIFICATE OF CORRECTION

PATENT NO. : 11,425,838 B2
APPLICATION NO. : 17/108085
DATED : August 23, 2022
INVENTOR(S) : Jerome G. Antaran It is certified that error appears in the above-identified patent and that said Letters Patent is hereby corrected as shown below:

In the Claims

Column 7, Claim 1, Line 12, add "the first protrusion part including a locking structure to fix the electronic device into the receiving structure when an external force is not applied to the second end part;"

Column 8, Claim 9, Line 7, change "second electronic module" to "an adjacent electronic device"

Signed and Sealed this
Twenty-first Day of February, 2023

Katherine Kelly Vidal
*Director of the United States Patent and Trademark Office*